United States Patent [19]
Harada

[11] Patent Number: 5,307,513
[45] Date of Patent: Apr. 26, 1994

[54] CHANNEL FREQUENCY STORING METHOD FOR A VEHICLE RADIO

[75] Inventor: Hiroshi Harada, Zama, Japan

[73] Assignee: Nissan Motor Co., Ltd., Yokohama, Japan

[21] Appl. No.: 766,072

[22] Filed: Sep. 27, 1991

[30] Foreign Application Priority Data

Sep. 27, 1990 [JP] Japan ................................ 2-255219

[51] Int. Cl.$^5$ .............................................. H04B 1/16
[52] U.S. Cl. ............................... 455/186.1; 455/166.2; 455/161.3; 455/345
[58] Field of Search ............... 455/186.1, 186.2, 185.1, 455/161.3, 166.1, 166.2, 77, 152.1, 345, 161.1, 161.2

[56] References Cited

U.S. PATENT DOCUMENTS 4,367,559  1/1983  Tults .................................. 455/166.2
5,086,511  2/1992  Kobayashi et al. ............... 455/186.1

OTHER PUBLICATIONS

"Service Weekly"; by Nissan Corp. No. 626, Jun. 1989, pp. E-46-53.

Primary Examiner—Reinhard J. Eisenzopf
Assistant Examiner—Philip J. Sobutka
Attorney, Agent, or Firm—Foley & Lardner

[57] ABSTRACT

In an autoradio such that a desired broadcasting channel can be received by reading a channel frequency from a preset memory in which plural channel frequencies are previously stored (one-touch station selection), the preset memory is provided with a table for storing plural channels classified according to each of plural broadcasting areas, and a receivable channel frequency is stored at corresponding channel memory spaces of all the broadcasting areas of the preset memory when any channel frequency is not yet stored but at only a corresponding channel memory space of the current broadcasting area thereof when already stored, whenever a preset switch is depressed. When a station automemory switch is depressed, the above operation is executed automatically to store all receivable channel frequencies. Since all the channel frequencies can be stored in the preset memory according to the broadcasting areas, it is possible to hear any desired channel by simple one-touch station selection, no matter when the vehicle travels in any broadcasting areas.

8 Claims, 5 Drawing Sheets

FIG.3 (a)

| CHANNEL<br>AREA | 1 | 2 | 3 |
|---|---|---|---|
| 1st (EAST) | — | — | — |
| 2nd (WEST) | 77.3 | 80.2 | 85.1 |
| 3rd (NORTH) | — | — | — |
| 4th (NORTHMOST) | — | — | — |

→ (S-4)

| CHANNEL<br>AREA | 1 | 2 | 3 |
|---|---|---|---|
| 1st (EAST) | 84.7 | — | — |
| 2nd (WEST) | 77.3 | 80.2 | 85.1 |
| 3rd (NORTH) | — | — | — |
| 4th (NORTHMOST) | — | — | — |

FIG.3 (b)

| CHANNEL<br>AREA | 1 | 2 | 3 |
|---|---|---|---|
| 1st (EAST) | — | — | — |
| 2nd (WEST) | — | — | — |
| 3rd (NORTH) | — | — | — |
| 4th (NORTHMOST) | — | — | — |

→ (S-5)

| CHANNEL<br>AREA | 1 | 2 | 3 |
|---|---|---|---|
| 1st (EAST) | 84.7 | — | — |
| 2nd (WEST) | 84.7 | — | — |
| 3rd (NORTH) | 84.7 | — | — |
| 4th (NORTHMOST) | 84.7 | — | — |

FIG.5 (a)

| CHANNEL / AREA | 1 | 2 | 3 |
|---|---|---|---|
| 1st (EAST) | — | — | — |
| 2nd (WEST) | 77.3 | 80.2 | 85.1 |
| 3rd (NORTH) | — | — | — |
| 4th (NORTHMOST) | — | — | — |

↓ (S-10)

| CHANNEL / AREA | 1 | 2 | 3 |
|---|---|---|---|
| 1st (EAST) | 77.1 | 80.0 | 82.5 |
| 2nd (WEST) | 77.3 | 80.2 | 85.1 |
| 3rd (NORTH) | — | — | — |
| 4th (NORTHMOST) | — | — | — |

FIG.5 (b)

| CHANNEL / AREA | 1 | 2 | 3 |
|---|---|---|---|
| 1st (EAST) | — | — | — |
| 2nd (WEST) | — | — | — |
| 3rd (NORTH) | — | — | — |
| 4th (NORTHMOST) | — | — | — |

↓ (S-11)

| CHANNEL / AREA | 1 | 2 | 3 |
|---|---|---|---|
| 1st (EAST) | 77.1 | 80.0 | 82.5 |
| 2nd (WEST) | 77.1 | 80.0 | 82.5 |
| 3rd (NORTH) | 77.1 | 80.0 | 82.5 |
| 4th (NORTHMOST) | 77.1 | 80.0 | 82.5 |

CHANNEL FREQUENCY STORING METHOD FOR A VEHICLE RADIO

BACKGROUND OF THE INVENTION

1. Field of the Invention

The present invention relates to a channel frequency storing method for a vehicle radio, and more specifically to a channel storing method for a vehicle radio which can facilitate listening to radio broadcasting and traffic information in plural broadcasting areas, when the vehicle is travelling from one broadcasting area to another broadcasting area.

2. Description of the Prior Art

In general, there are plural broadcasting areas in any one country (e.g. there are ten major broadcasting areas in Japan). Further, there are a few or several broadcasting stations (i.e. channels) in one broadcasting area, and further the frequencies of these plural channels are different from each other in one area and further are different in plural areas from each other.

In the conventional vehicle radio, in general a plurality of channel frequencies in only a single broadcasting area are previously selected and stored in a memory, so that any desired radio broadcasting channel can be received by simply depressing a key (one-touch station selection), as disclosed in "Service Weekly" by NISSAN Corp. No. 656, Jun. 1989, E-46 to 50.

In the prior-art vehicle radio as described above, however, since the number and the area of broadcasting channels which can be previously selected are limited (e.g. 6 AM stations and 6 FM stations in one broadcasting area), there exists a problem in that it is impossible to hear radio broadcasts or traffic information in a vehicle when travelling through different broadcasting areas by such a one-touch station selection method.

In more detail, whenever the vehicle travels from one broadcasting area to another broadcasting area, the driver must newly select channels whose radio wave field intensities exceed a predetermined level by manual tuning or automatic tuning and then store these selected channels again in the preset memory. Further, in the case of SAM (station automemory method), previously selected channels are once erased and then newly selected channels are overwritten again in the preset memory, thus resulting in a problem in that it takes a great deal of time to select and preset new broadcasting stations or channel frequencies whenever the vehicle enters a new broadcasting area.

SUMMARY OF THE INVENTION

With these problems in mind, therefore, it is the primary object of the present invention to provide a channel frequency storing method for a vehicle radio which can previously select and store any desired broadcasting stations or channel frequencies in the preset memory according to plural broadcasting areas.

To achieve the above-mentioned object, the method of storing channel frequencies in an a vehicle radio according to the present invention, comprises the steps of: (a) determining a current broadcasting area where the vehicle is now travelling; (b) tuning a radio receiver to a first channel frequency in the current broadcasting area; (c) checking whether another channel frequency is previously stored in another broadcasting area's space of a preset memory; (d) if not stored, storing the first tuned channel frequency at first channel memory spaces for all broadcasting areas of the preset memory as the first channel frequency; (e) if stored, storing the first tuned, channel frequency at only a first channel memory space for the current broadcasting area of the preset memory as the first channel frequency without erasing the channel frequency data already elsewhere stored in the preset memory; and (f) repeating the above steps (b) to (e) to store plural channel frequencies in plural channel memory spaces for plural broadcasting areas in the preset memory for enabling one-touch station selection.

A single tuned channel frequency can be manually stored in the preset memory whenever a preset switch is depressed, and plural tuned channel frequencies are automatically stored in sequence in the preset memory when a station automemory switch is depressed. The current broadcasting area can be manually determined when an area switch is depressed or automatically by comparing plural automatically tuned channel frequencies in a broadcasting area with those stored in a frequency memory for storing plural channel frequencies classified according to plural broadcasting areas.

Further, the vehicle radio according to the present invention comprises: (a) a receiver unit for tuning broadcasting channel frequencies; (b) a level detector for detecting channel frequencies whose radio wave field intensity level exceeds a predetermined level, to determine receivable channel frequencies; (c) a preset memory for storing plural receivable channel frequencies being classified according to plural broadcasting areas; (d) a mode switch for selecting one channel frequency from the preset memory; (e) an area switch for determining a broadcasting area; (f) a preset switch for manually storing a receivable channel frequency in the preset memory; and (g) control means for storing the receivable channel frequency at corresponding channel memory spaces of all broadcasting areas of the preset memory when any channel frequency is not yet stored in the preset memory, but at only a corresponding channel memory space of the current broadcasting area of the preset memory when any frequency is already stored in another broadcasting area of the preset memory, whenever the preset switch is depressed. Further, the vehicle radio further comprises a station automemory switch, the control means automatically storing the plural receivable channel frequencies in sequence at corresponding channel memory spaces for all the broadcasting areas of the preset memory when any channel frequency is not yet stored in the preset memory, but at only a corresponding channel memory space of the current broadcasting area of the preset memory when any frequency is already stored in another broadcasting area of the preset memory, when the station memory switch is depressed. Further, the vehicle radio further comprises a frequency memory for storing plural channel frequencies classified according to plural broadcasting areas, to automatically determine the current broadcasting area by comparing plural receivable channel frequencies in the current broadcasting area with those stored in the frequency memory.

In the method of storing channel frequencies in a vehicle radio according to the present invention, since the current broadcasting area and channel frequencies can be determined on the basis of the tuned and detected radio waves and additionally received channel frequencies are stored manually or automatically at corresponding channel memory spaces for all the broadcasting areas of the preset memory when any channel frequency is not yet stored but at only a corresponding channel memory space of the current broadcasting area thereof when already stored, it is possible to hear any desired channel or traffic information by a simple one-touch station selection, when the vehicle travels in any of the broadcasting areas.

BRIEF DESCRIPTION OF THE DRAWINGS

FIGS. 3(a) and (b) are tables for assistance in explaining the method of storing a newly tuned frequency in the preset memory by use of the preset switch, in which FIG. 3(a) shows the case where some frequencies are already stored for another broadcasting area and FIG. 3(b) shows the case where no frequencies are stored for any of the broadcasting areas;

FIG. 5(a) and (b) are tables for assistance in explaining the method of storing newly tuned frequencies in the preset memory by use of the SAM switch, in which FIG. 5(a) shows the case where frequencies are already stored for another broadcasting area and FIG. 3(b) shows the case where no frequencies are stored for any of the broadcasting areas.

DETAILED DESCRIPTION OF THE PREFERRED EMBODIMENTS

An embodiment of the channel frequency storing method for an vehicle radio according to the present invention will be described hereinbelow with reference to the attached drawings.

Figure 1:
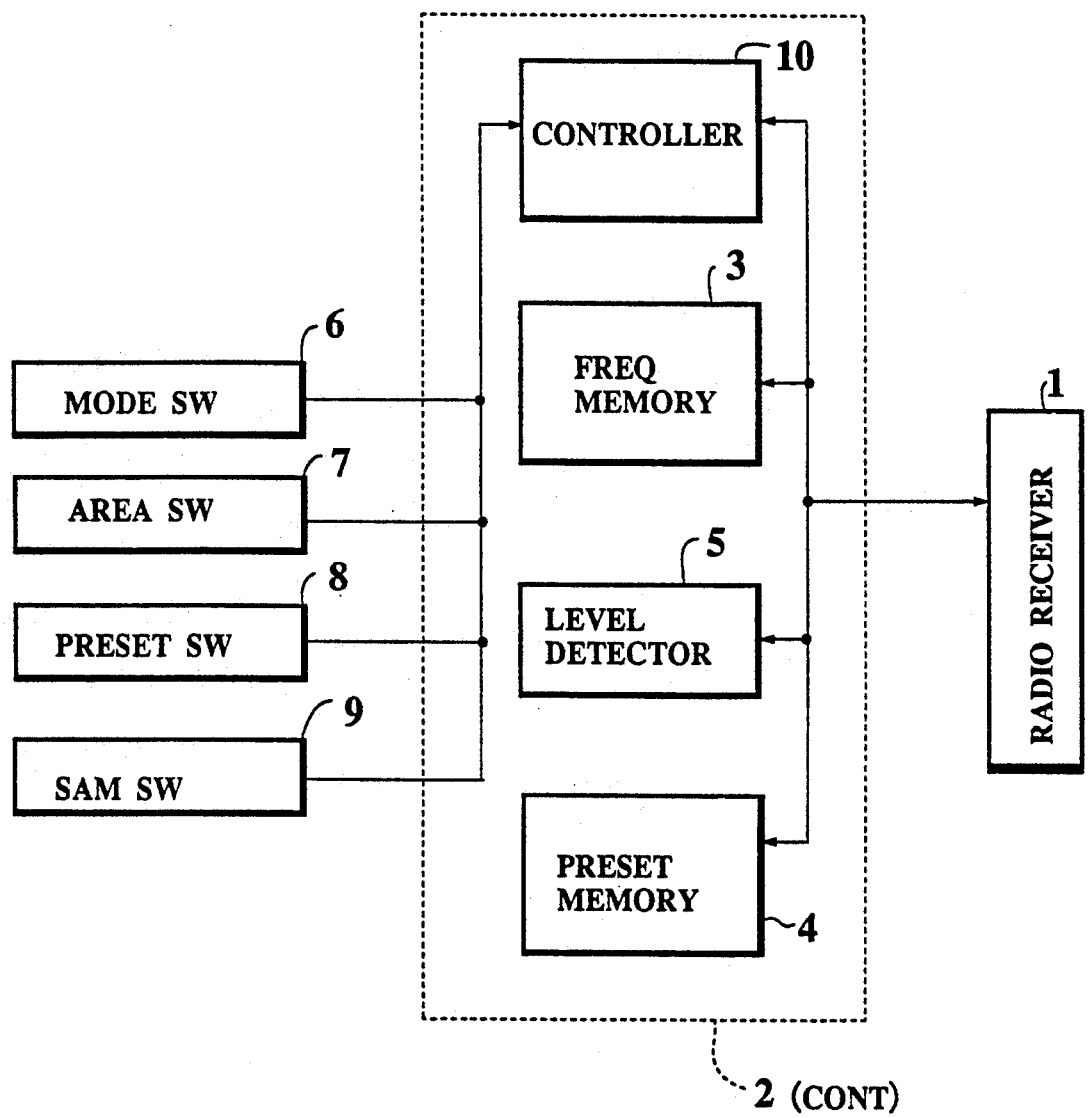
FIG. 1 is a block diagram showing a basic configuration of embodiments of the vehicle radio according to the present invention.

FIG. 1 shows a basic configuration of the vehicle radio which roughly comprises a radio receiver unit 1, a control unit 2, and various switches 6 to 9. The control unit 2 includes a controller 10, a frequency memory 3, a level detector 5, and a preset memory 4.

A mode switch 6 is used to select the radio modes such as power-on/off, manual/auto tuning, AM/FM reception, sound volume adjustment, channel selection, etc. An area switch 7 is used to select one of plural broadcasting areas (e.g. east, west, north, northmost, etc.). A preset switch 8 is used to manually store one by one any channel frequency now being received in the preset memory 4. A SAM (station automemory) switch 9 is used to automatically store channel frequencies now being sought (auto-tuned) in sequence in the preset memory 4.

A frequency memory 3 previously stores plural broadcasting frequencies (channels) classified according to plural broadcasting areas. A level detector 5 detects whether the field intensity of the radio wave of each tuned and received channel frequency exceeds a predetermined level to select any of the receivable channel frequencies.

When the area switch 7 is depressed, the current broadcasting area is indicated to the controller 10. However, it is also possible to automatically determine the current broadcasting area by comparing plural autotuned channel frequencies in the current broadcasting area with those stored in the frequency memory 3 for storing plural channel frequencies classified according to plural broadcasting areas.

Whenever the preset switch 8 is depressed, a channel frequency now being received beyond a predetermined level is manually stored one by one in the preset memory 4.

Whenever the SAM (station automemory) switch 9 is depressed, channel frequencies now being auto-tuned beyond a predetermined level are automatically stored in sequence in the preset memory 4.

Figure 2:
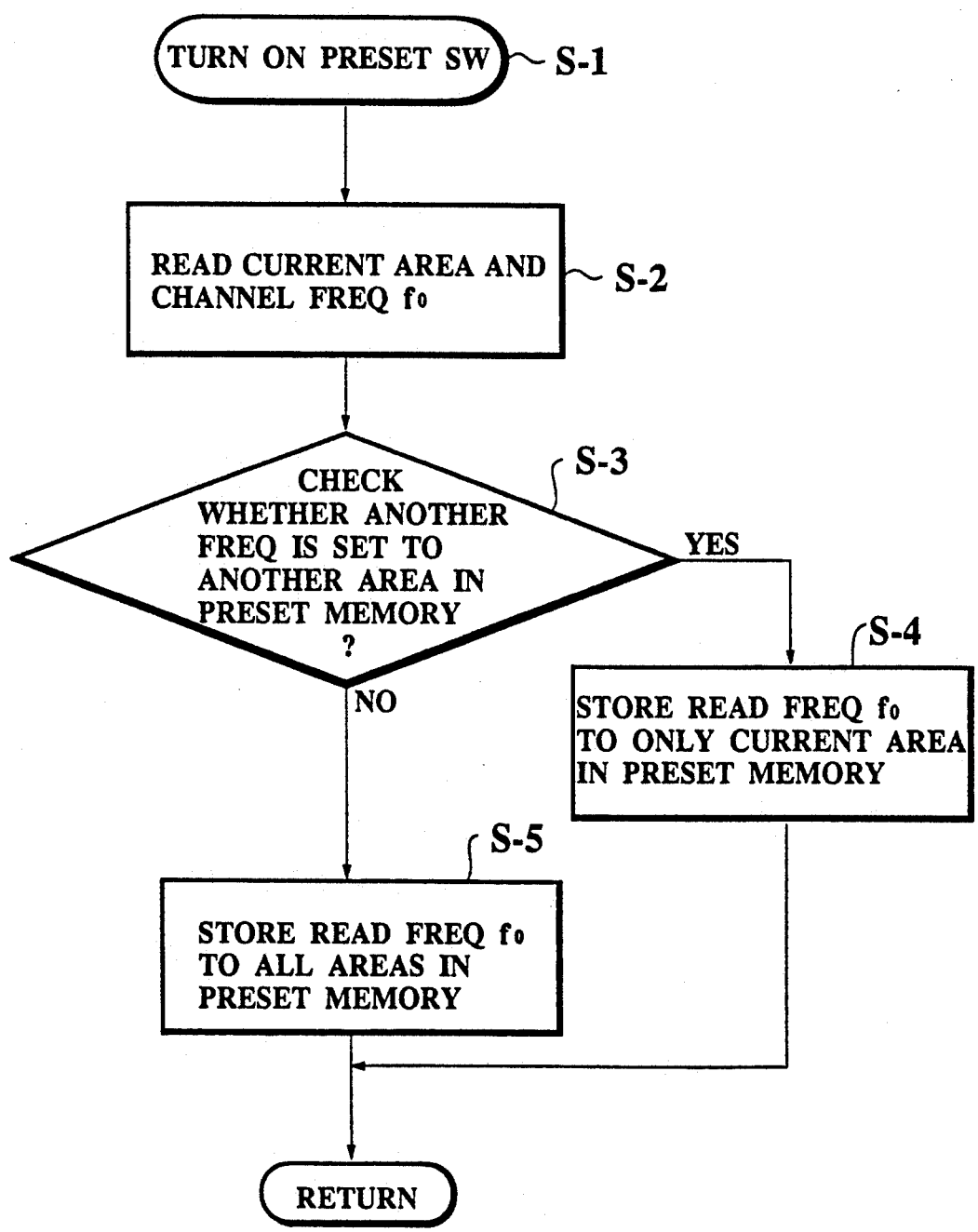
FIG. 2 is a flowchart for assistance in explaining the channel frequency setting procedure on the basis of the preset switch of the vehicle radio according to the present invention.

The procedure of storing channel frequencies for a broadcasting area in the preset memory 4 by use of the preset switch 8 will be described hereinbelow with reference to FIG. 2.

First, the radio mode switch 6 is turned on to activate the receiver unit 1, and the area switch 7 is depressed to select a broadcasting area (e.g. 1st least) area). Therefore, a broadcasting frequency (i.e. channel) for the selected broadcasting area can be received by manual-/auto tuning. Under these conditions, when the preset switch 8 is depressed (in step S-1), controller 10 reads the selected area and then starts the station manual memory operation (in step S-2). That is, the level detector 5 of the control unit 2 checks whether the field intensity of the tuned channel frequency exceeds a predetermined level as a receivable channel frequency. If the tuned frequency is a receivable frequency, controller 10 reads this channel frequency $f_0$ as the first receivable channel frequency for the current (e.g. 1st) broadcasting area (in step S-2). Subsequently, controller 10 checks whether at least one frequency has already been stored for another broadcasting area in the preset memory 4 (in step S-3). If YES as shown by the upper table in FIG. 3(a) (in step S-3), controller 10 stores the read frequency $f_0$ (e.g. 84.7) in only a first channel memory space for the selected broadcasting (1st) area in the preset memory 4 as the first channel frequency, as shown by the lower table in FIG. 3(a) (in step S-4). However, if NO as shown by the upper table in FIG. 3(b) (in step S-3), control stores the read frequency $f_0$ (e.g. 84.7) in first channel memory spaces of all the broadcasting areas in the preset memory 4 as the first channel frequency, as shown by the table in FIG. 3(b) (in step S-5). In the above step S-5, although the read frequency $f_0$ (e.g. 84.7) is set in first channel memory spaces for all the broadcasting areas of the preset memory 4, since this frequency $f_0$ can be replaced with another correct frequency whenever the vehicle travels in another broadcasting area, no problem arises until the vehicle moves to another broadcasting area. By repeating the above steps, that is, by selecting other receivable channel frequencies in the current broadcasting area and depressing the preset switch 8, it is possible to store plural desired channel frequencies (whose radio wave field intensity exceeds a predetermined level) in the preset memory 4. Once stored in the preset memory 4, it is possible to select any desired channel frequency by one-touch station selection in the same way as with the case of the conventional vehicle radio by use of the channel select switches of the mode switch 6.

Figure 4:
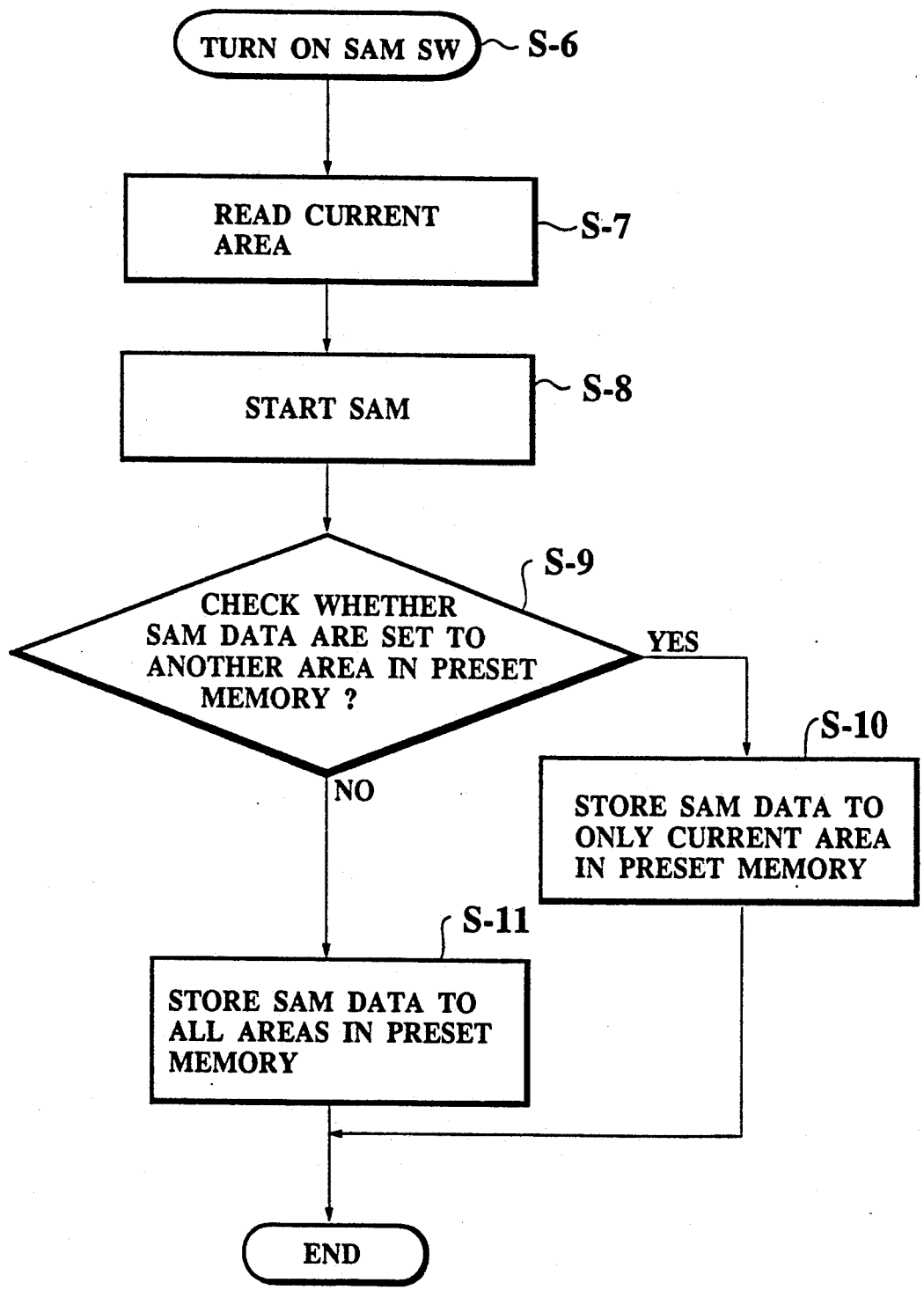
FIG. 4 is a flowchart for assistance in explaining the channel frequency setting procedure on the basis of the SAM (station automemory switch) of the vehicle radio according to the present invention.

The procedure of storing channel frequencies for a broadcasting area in the preset memory 4 by use of the SAM switch 9 will be described hereinbelow with reference to FIG. 4.

First, the radio mode switch 6 is turned on to activate the receiver unit 1 and the area switch 7 is depressed to select a broadcasting area (e.g. 1st (east) area). Therefore, a broadcasting frequency (i.e. channel) for the selected broadcasting area can be received by automatic tuning. Under these condition, when the SAM switch 9 is depressed (in step S-6), controller 10 reads the selected broadcasting area (in step S-7) and then starts the station automemory (SAM) operation (in step S-8). That is, the level detector 5 of the control unit 2 checks whether the field intensities of plural auto-tuned channel frequencies exceed a predetermined level as receivable frequencies. If these auto-tuned frequencies are receivable frequencies, controller 10 determines these channel frequencies as the receivable channel frequencies (SAM data) for the current broadcasting area (in step S-8). Subsequently, controller 10 checks whether SAM data (frequencies) have already been stored for another broadcasting area in the preset memory 4 (in step S-9). If YES as shown by the upper table in FIG. 5(a) (in step S-9) controller 10 stores the determined SAM data (e.g. 77.1; 80.0; 82.5) in sequence in only a corresponding channel memory space for the selected broadcasting (1st) area in the present memory 4 as the first area SAM data, as shown by the lower table in FIG. 5(a) (in step S-10). However, if NO as shown by the upper table in FIG. 5(b) (in step S-9), control stores the SAM data (e.g. 77.1; 80.0; 82.5) in corresponding channel memory spaces of all the broadcasting areas in the preset memory as the first area SAM data as shown by the lower table in FIG. 5(b) (in step S-11). In the above step S-11, although the SAM data are set in corresponding channel memory spaces for all the broadcasting areas of the preset memory 4, since these SAM data can be replaced with other correct SAM data whenever the vehicle travels in other broadcasting areas, no problem arises until the vehicle moves to another broadcasting area. In this SAM operation, it is possible to automatically store all the channel frequencies (whose radio wave field intensity exceeds a predetermined level) in sequence in the preset memory 4, by once depressing the SAM switch 9. Once stored in the preset memory 4, it is possible to select any desired channel by one-touch station selection in the same way as with the case of the conventional vehicle radio by use of the channel select switches of the mode switch 6.

As described, in the channel frequency storing method for an vehicle radio according to the present invention, since the selected channel frequencies or SAM data are stored in the corresponding channel memory spaces for all the broadcasting areas of the preset memory 4 when no data have been stored therein, it is possible to store selected data correctly in the preset memory 4, in case an erroneous broadcasting area is selected. Further, when data have already been stored in a channel memory space for a broadcasting area of the preset memory, since the selected channel frequencies or SAM data are stored in only a corresponding channel memory space for the current broadcasting area of the preset memory 4, without erasing the already stored channel frequencies, it is possible to effectively store all the channel frequencies for all the broadcasting areas of the preset memory whenever the vehicle travels in plural broadcasting areas. Further, it is possible in store these channel frequencies ,to the preset memory 4 even if the driver does not know the channel frequency values at various broadcasting areas.

Further, in the above-mentioned procedure, controller 10 reads the current broadcasting area whenever the broadcasting area switch 7 has been depressed. Without being limited thereto, it is also possible to automatically determine the current broadcasting area by the vehicle radio itself by comparing the automatically tuned frequencies (whose radio wave levels exceed a predetermined level) with those stored in the frequency memory 3 for storing various channel frequencies classified according to the broadcasting areas, as already described.

What is claimed is:

1. A method of storing channel frequencies in a vehicle radio receiver in a vehicle, said vehicle radio receiver having a resetable preset memory, said resetable preset memory having channel memory spaces classified for plural broadcasting areas, each of said plural broadcasting areas corresponding to a different geographic area, said method comprising the steps of:
   (a) determining in which of said plural broadcasting areas said vehicle is currently travelling;
   (b) tuning said radio receiver to a first channel frequency in the current broadcasting area;
   (c) checking whether another channel frequency is previously stored for any other broadcasting area in said preset memory;
   (d) if said another channel frequency is not stored in any other broadcasting area in said preset memory storing said first channel frequency in first channel memory spaces for all broadcasting areas of said preset memory as a first tuned channel frequency;
   (e) if said channel frequency is stored, in any other broadcasting area in said preset memory storing said firs channel frequency at only a first channel memory space for said current broadcasting area in said preset memory as said first tuned channel frequency, without erasing channel frequency data already stored in said preset memory for said any other broadcasting areas in said preset memory; and
   (f) repeating above steps (b) to (e) to store plural channel frequencies in plural channel memory spaces for plural broadcasting areas in said preset memory for enabling one-touch channel selection.

2. The method of claim 1, further comprising the step of storing a particular tuned channel frequency in said preset memory whenever a preset switch is manually depressed.

3. The method of claim 1, further comprising the step of automatically storing plural tuned channel frequencies in sequence in said preset memory whenever a station automemory switch is depressed.

4. The method of claim 1, further comprising the step of manually determining said current broadcasting area when an area switch is depressed.

5. The method of claim 1, further comprising the step of automatically determining a current broadcasting area by comparing plural automatically tuned channel frequencies for a broadcasting area with channel frequencies stored in a frequency memory storing plural channel frequencies classified according to plural broadcasting areas.

6. A vehicle radio, comprising:
   (a) a receiver unit for tuning receivable broadcasting channel frequencies;
   (b) a level detector for detecting channel frequencies having respective radio wave field intensity levels exceeding a predetermined level, to determine said receivable broadcasting channel frequencies;
   (c) a resetable preset memory for storing plural receivable broadcasting channel frequencies classified for plural broadcasting areas, each of said plural broadcasting areas corresponding to a different geographic area;

(d) a mode switch for selecting a particular channel frequency from said preset memory;
(e) an area switch for selecting a particular broadcasting area of said plural broadcasting areas;
(f) a preset switch for manually storing a receivable channel frequency in said preset memory; and
(g) control means for storing said receivable channel frequency in corresponding channel memory spaces for all broadcasting areas of said preset memory when any channel frequency is not yet stored in said preset memory, and at only a corresponding channel memory space of a current broadcasting area in said preset memory when any channel frequency is already stored in any other broadcasting area in said preset memory, whenever said preset switch is depressed.

7. The vehicle radio of claim 6, which further comprises:
a station automemory switch;
said control means automatically storing plural receivable channel frequencies in sequence at corresponding channel memory spaces for all broadcasting areas of said preset memory when any channel frequency is not yet stored in said preset memory, and at only a corresponding channel memory space for a current broadcasting area in said preset memory when any channel frequency is already stored for another broadcasting area in said preset memory, when said station automemory switch is depressed.

8. The vehicle radio of claim 6, which further comprises:
a frequency memory for storing plural channel frequencies, classified according to plural broadcasting areas; and
means for automatically determining a current broadcasting area by comparing plural receivable channel frequencies for said current broadcasting area with said plural channel frequencies stored in said frequency memory.

* * * * *